(12) United States Patent
Nakamura et al.

(10) Patent No.: US 9,763,349 B2
(45) Date of Patent: Sep. 12, 2017

(54) POWER SUPPLY CONTROL APPARATUS AND MANUFACTURING METHOD OF POWER SUPPLY CONTROL APPARATUS

(71) Applicants: KEIHIN CORPORATION, Tokyo (JP); HONDA MOTOR CO., LTD., Tokyo (JP)

(72) Inventors: Takeshi Nakamura, Utsunomiya (JP); Daiki Kudo, Utsunomiya (JP); Masashi Ueda, Sendai (JP); Kosuke Tachikawa, Torrance, CA (US); Tetsuya Hasebe, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 191 days.

(21) Appl. No.: 14/350,436

(22) PCT Filed: Oct. 4, 2012

(86) PCT No.: PCT/JP2012/075788
§ 371 (c)(1),
(2) Date: Apr. 8, 2014

(87) PCT Pub. No.: WO2013/054731
PCT Pub. Date: Apr. 18, 2013

(65) Prior Publication Data
US 2014/0254122 A1    Sep. 11, 2014

(30) Foreign Application Priority Data
Oct. 13, 2011  (JP) .................................. 2011-225913

(51) Int. Cl.
*H01R 9/00* (2006.01)
*H05K 7/06* (2006.01)
(Continued)

(52) U.S. Cl.
CPC ............... *H05K 7/06* (2013.01); *B29C 70/72* (2013.01); *H01M 10/48* (2013.01); *H01M 2220/20* (2013.01)

(58) Field of Classification Search
CPC ... B29C 70/72; H01M 10/48; H01M 2220/20; H05K 7/06
(Continued)

(56) References Cited

U.S. PATENT DOCUMENTS 6,097,173 A * 8/2000 Bryant, Jr. ............ H01M 2/206
320/107
6,111,387 A * 8/2000 Kouzu ................ H01M 10/613
320/107
(Continued)

FOREIGN PATENT DOCUMENTS

| JP | 2010-56035 A | 3/2010 |
|---|---|---|
| JP | 2010097722 A | 4/2010 |

(Continued)

OTHER PUBLICATIONS

Japanese Notice of Reasons for Rejection corresponding to Application No. 2013-538517; Date of Mailing: Oct. 14, 2014, with English translation.
(Continued)

*Primary Examiner* — Yuriy Semenenko
(74) *Attorney, Agent, or Firm* — Cantor Colburn LLP

(57) ABSTRACT

A power supply control apparatus includes: a control board that is configured to control a voltage of a battery module; and a bus bar module that is configured to electrically connect the control board to the battery module, the control board and the bus bar module are arranged in a stacked manner, and the bus bar module includes a plurality of bus bars that are made to be independent by cutting off junctions connecting the bus bars to each other and a resin member
(Continued)

that supports the bas bars in a state where the junctions are exposed.

9 Claims, 5 Drawing Sheets

(51) Int. Cl.
  *H01M 10/48* (2006.01)
  *B29C 70/72* (2006.01)
(58) Field of Classification Search
  USPC ............ 361/775, 767, 774; 174/74 R, 70 B, 174/72 B; 439/668, 628, 952
  See application file for complete search history.

(56) References Cited

U.S. PATENT DOCUMENTS

| | | | | |
|---|---|---|---|---|
| 8,377,584 | B2 * | 2/2013 | Suzuki | H01M 2/1077 429/121 |
| 8,993,142 | B2 * | 3/2015 | Sakai | B60L 11/1874 180/68.5 |
| 9,034,496 | B2 * | 5/2015 | Adachi | H01M 10/4207 429/53 |
| 2002/0102457 | A1 * | 8/2002 | Oogami | B60L 3/0046 429/159 |
| 2010/0052692 | A1 * | 3/2010 | Yano | H01M 2/1083 324/427 |
| 2015/0364740 | A1 * | 12/2015 | De Arroyabe | B23K 20/004 429/90 |

FOREIGN PATENT DOCUMENTS

| | | | |
|---|---|---|---|
| JP | 2010-114025 A | | 5/2010 |
| JP | 2012539767 | * | 10/2010 |
| JP | 2011-18478 A | | 1/2011 |
| JP | 2012520540 A | | 9/2012 |
| WO | 2010102855 A1 | | 9/2010 |
| WO | 2011/111676 A1 | | 9/2011 |
| WO | 2012053610 A1 | | 4/2012 |

OTHER PUBLICATIONS

International Search Report for PCT/JP2012/075788; Date of Mailing, Dec. 4, 2012 with English translation.

* cited by examiner

POWER SUPPLY CONTROL APPARATUS AND MANUFACTURING METHOD OF POWER SUPPLY CONTROL APPARATUS

This is the U.S. national stage of application No. PCT/JP2012/075788, filed on 4 Oct. 2012. Priority under 35 U.S.C. §119(a) and 35 U.S.C. §365(b) is claimed from Japanese Application No. 2011-225913, filed 13 Oct. 2011, the disclosure of which is also incorporated herein by reference.

TECHNICAL FIELD OF THE INVENTION

The present invention relates to a power supply control apparatus and a manufacturing method of the power supply control apparatus.

Priority is claimed on Japanese Patent Application No. 2011-225913, filed Oct. 13, 2011, the content of which is incorporated herein by reference.

BACKGROUND ART

A battery system mounted on a hybrid vehicle or an electric vehicle includes a control board that detects a voltage of a battery so as to prevent degradation of the battery due to overcharge or the like. As described in Patent Document 1, the control board is installed on a battery module including multiple batteries and is electrically connected to the respective batteries.

PRIOR ART DOCUMENTS

Patent Documents

Patent Document 1: Japanese Unexamined Patent Application, First Publication No. 2010-56035

SUMMARY OF THE INVENTION

Problems to be Solved by the Invention

On the other hand, a bus bar module may be disposed between the battery module and the control board, because of a difference in arrangement position or shape between connection terminals of the battery module and connection terminals of the control board.

The bus bar module includes bus bars and a resin member supporting the bus bars and connects the connection terminal of the battery modules and the connection terminals of the control board to each other.

The bus bar module and the control board serve as a power supply control apparatus in cooperation with each other. That is, the above-mentioned battery system has a configuration in which the power supply control apparatus is installed on the battery module.

The bus bar module includes conductive bus bars and the resin member supporting the bus bars. One connection terminal of the battery module and one connection terminal of the control board are electrically connected to each other with one bus bar. Since the battery module and the control board each include multiple connection terminals, the bus bar module includes multiple bus bars.

The bus bar module is generally manufactured by insert molding. However, since the number of bus bars is large, it is difficult to accurately position the bus bars. The handling properties of the bus bars at the time of manufacturing the bus bar module are poor and thus workability is also poor.

The bus bars may have various shapes depending on the arrangements of two connection terminals to be electrically connected to each other. Accordingly, in order to form all the bus bars of the bus bar module, for example, multiple molds are necessary, thereby causing an increase in manufacturing costs.

The present invention is made in consideration of the above-mentioned problem and an object thereof is to easily manufacture a power supply control apparatus by improving workability at the time of manufacturing a bus bar module and to reduce the manufacturing cost of the power supply control apparatus by reducing the manufacturing cost of the bus bar module.

Means for Solving the Problems

The present invention employs the following configurations as measures for achieving the above-mentioned object.

(1) According to an aspect of the present invention, there is provided a power supply control apparatus including: a control board that is configured to control a voltage of a battery module; and a bus bar module that is configured to electrically connect the control board and the battery module, wherein the control board and the bus bar module are arranged in a stacked manner, and the bus bar module includes a plurality of bus bars that are made to be independent by cutting off junctions connecting the bus bars to each other and a resin member that supports the bas bars in a state where the junctions are exposed.

(2) In the power supply control apparatus according to (1), the resin member may include an opening portion that penetrates the resin member form the front surface thereof to the rear surface thereof (3) In the power supply control apparatus according to (2), the junctions may be exposed from the opening portion.

(4) According to another aspect of the present invention, there is provided a manufacturing method of a power supply control apparatus which includes a control board that controls a voltage of a battery module and a bus bar module that electrically connects the control board and the battery module, in which the control board and the bus bar module are arranged in a stacked manner, the manufacturing method including: integrally molding a bus bar assembly including a plurality of bus bars connected to each other by junctions and a resin member so as to expose the junctions; and making the bus bars to be independent by cutting off the junctions after the integral molding.

Effect of the Invention

According to aspects of the present invention, the bus bars are made to be independent by cutting off the junctions connecting the bus bars to each other. The bus bar module can be manufactured by molding the multiple bus bars together in a state (bus bar assembly) in which the multiple bus bars are connected to each other with the junctions, incorporating the bus bar assembly and the resin member into a body, and then cutting off the junctions. Therefore, according to aspects of the present invention, it is possible to manufacture the bus bar module by insert-molding the bus bar assembly in which the multiple bus bars are incorporated into a body and it is thus possible to more easily manufacture the bus bar module in comparison with a case where the bus bar module is manufactured by insert-molding individual bus bars. According to aspects of the present invention, since the manufacturing of the bus bar module is facilitated in this way, it is possible to easily manufacture the power supply control apparatus. Additionally, according to aspects of the present invention, the bus bar assembly can be formed using one mold. Accordingly, it is not necessary to prepare a mold for each bus bar and it is thus possible to reduce the manufacturing cost of the bus bar module. According to aspects of the present invention, since the manufacturing cost of the bus bar module is reduced in this way, it is possible to reduce the manufacturing cost of the power supply control apparatus.

DESCRIPTION OF EMBODIMENTS

Hereinafter, a power supply control apparatus according to an embodiment of the present invention will be described with reference to the accompanying drawings. In the following drawings, in order to make members recognizable, scales of the members are appropriately changed.

Figure 1:
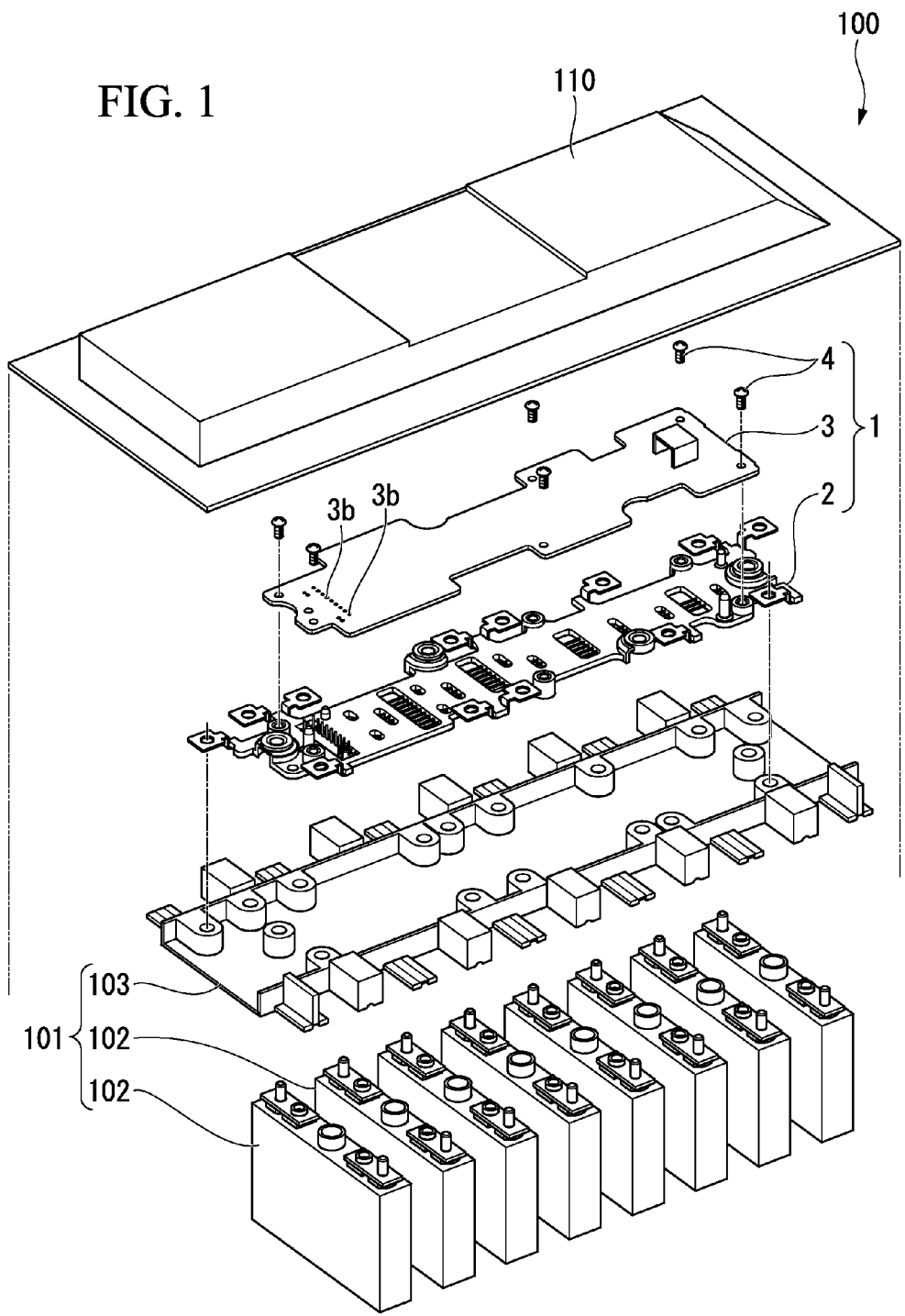
FIG. 1 is an exploded perspective view illustrating a battery system including a power supply control apparatus according to an embodiment of the present invention.

FIG. 1 is an exploded perspective view schematically illustrating a configuration of a battery system 100 including a power supply control apparatus 1 according to this embodiment. As illustrated in the drawing, the battery system 100 includes a battery module 101, a power supply control apparatus 1 according to this embodiment, and a cover 110.

The battery module 101 includes batteries 102, a terminal block 103, and a not-illustrated fixed block. The battery 102 is a storage battery which can be charged and discharged and has terminals disposed on the upper portion thereof The multiple batteries 102 are fixed to the not illustrated fixed block. The batteries 102 are arranged in the same form. The terminal block 103 is a block for fixing connection terminals of the batteries 102 and includes connection terminals for electrically connecting the batteries 102 to the power supply control apparatus 1. The connection terminals of the terminal block 103 are disposed in a predetermined arrangement pattern on a top surface of the terminal block 103. Since the connection terminals disposed on the top surface of the terminal block 103 serve as connection terminals for electrically connecting the battery module 101 to the power supply control apparatus 1, the connection terminals disposed on the top surface of the terminal block 103 are referred to as connection terminals of the battery module 101 in the following description.

The power supply control apparatus 1 according to this embodiment is disposed on the battery module 101 and includes a bus bar module 2, a control board 3, and screws 4. The bus bar module 2 and the control board 3 are stacked with the bus bar module 2 located on the lower side (the side of the battery module 101) and the control board 3 located on the upper side (the opposite side of the battery module 101) and are integrated by fastening using the screws 4.

Figure 2A:
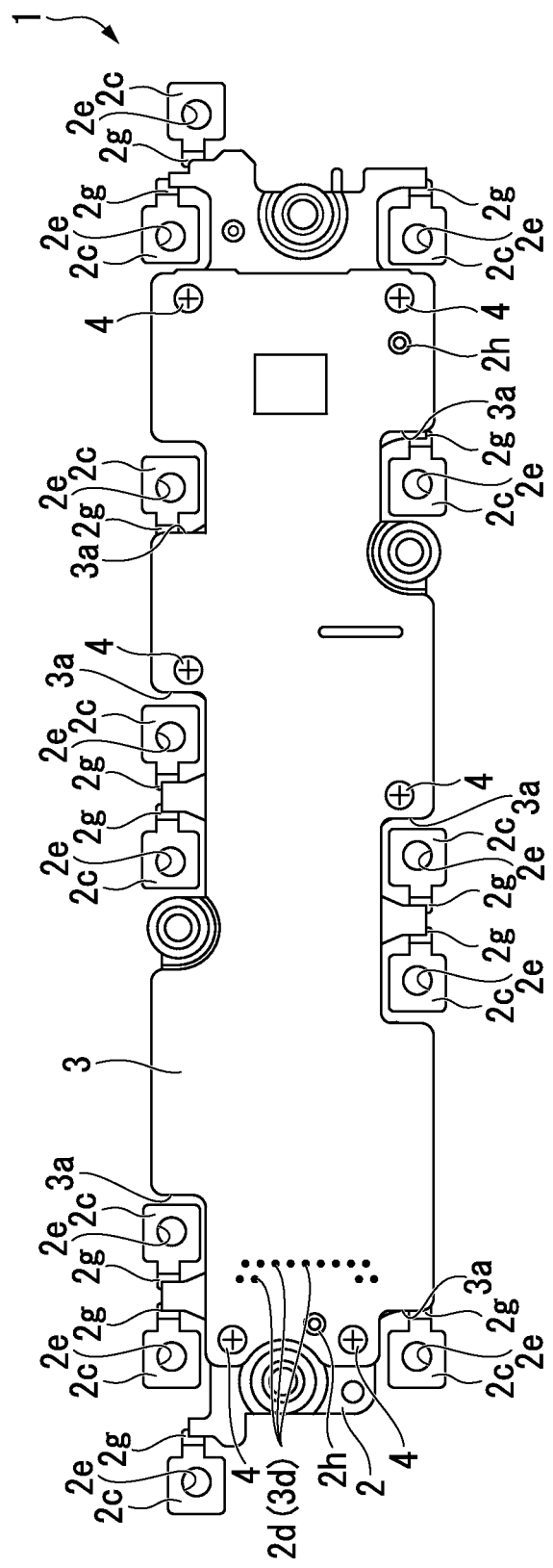
FIG. 2A is a plan view illustrating the power supply control apparatus according to the embodiment of the present invention including a control board and screws.
Figure 2B:
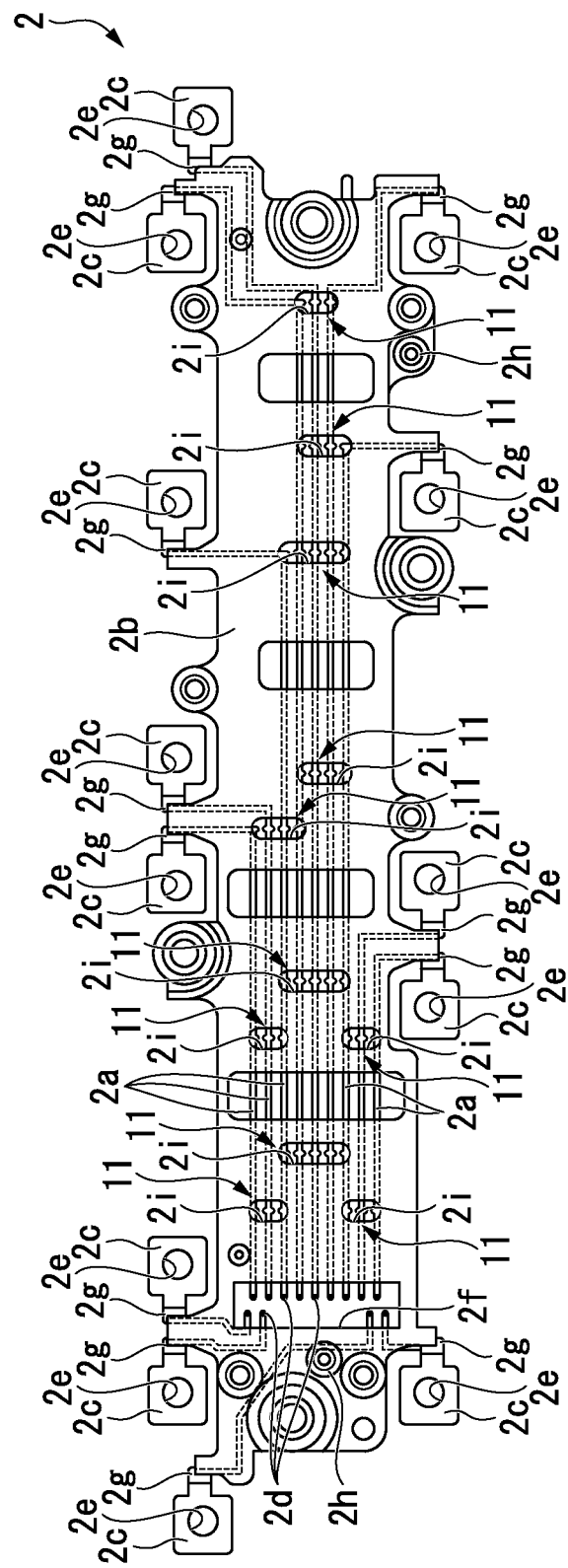
FIG. 2B is a plan view illustrating the power supply control apparatus in which the control board and screws are omitted.
Figure 3:
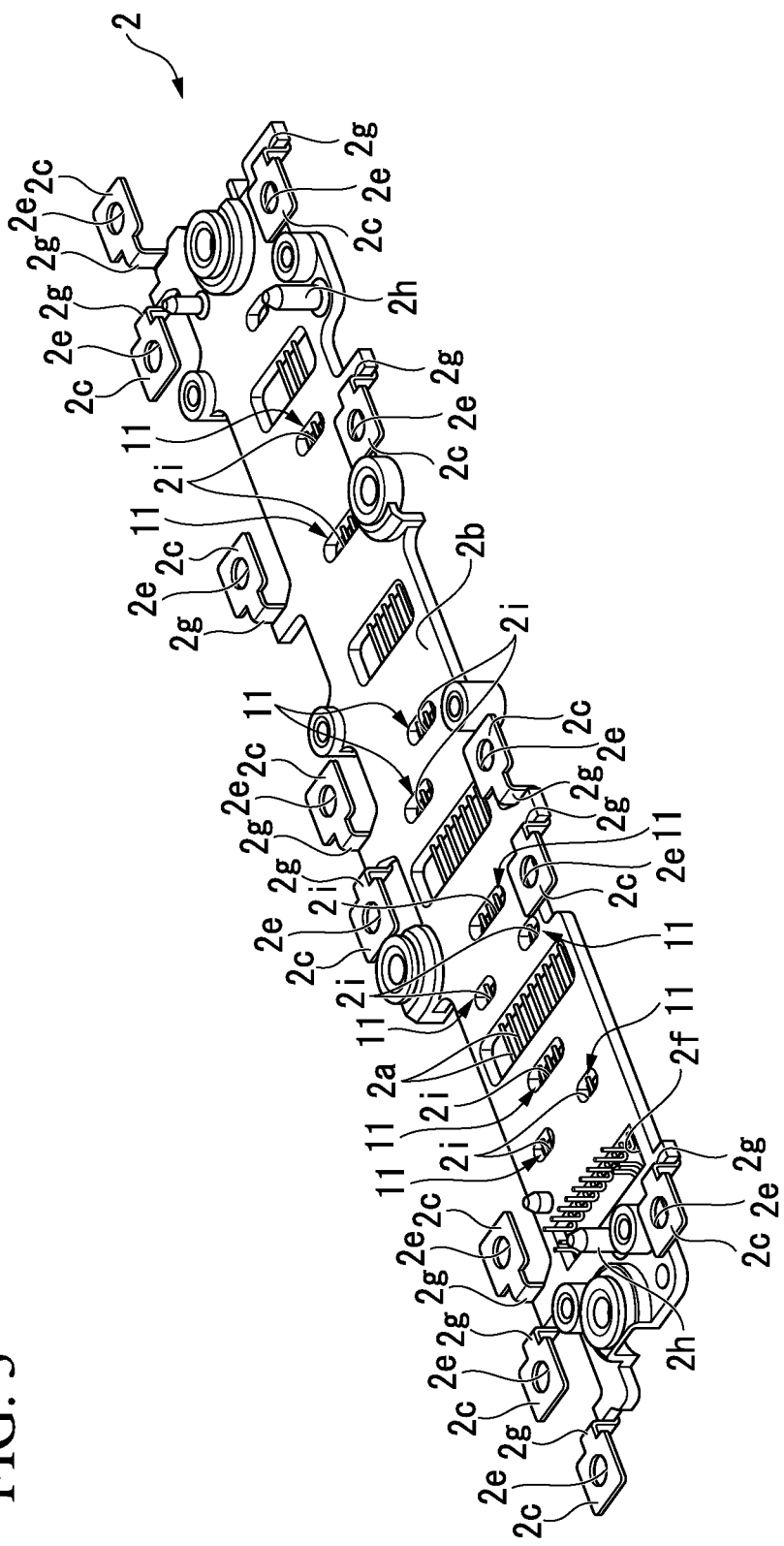
FIG. 3 is a perspective view illustrating the control board of the power supply control apparatus according to the embodiment of the present invention.
Figure 4:
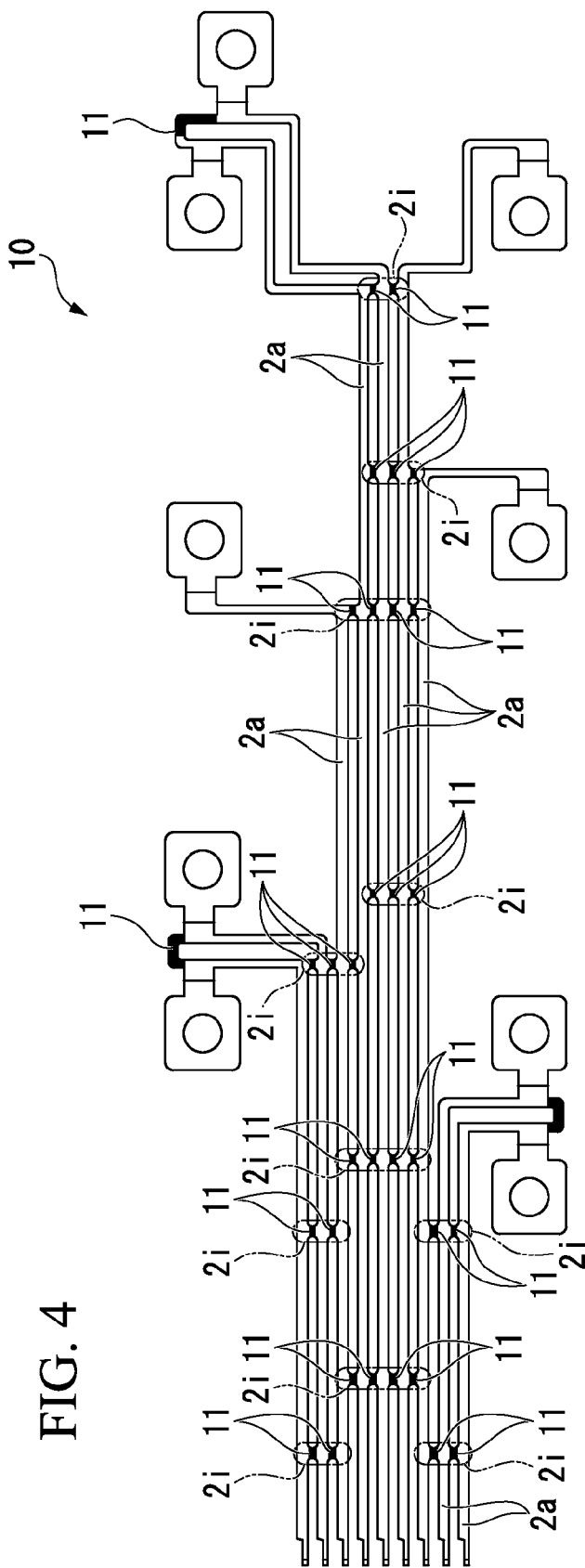
FIG. 4 is a plan view illustrating a state before multiple bus bars of the power supply control apparatus according to the embodiment of the present invention are made to be independent.

Hereinafter, the power supply control apparatus 1 according to this embodiment will be described in more detail with reference to FIGS. 2A to 4. FIGS. 2A and 2B are plan views of the power supply control apparatus 1 according to this embodiment. FIG. 2A is a plan view of the power supply control apparatus 1 in which the control board 3 and the screws 4 are included. FIG. 2B is a plan view (that is, only the bus bar module 2 is illustrated) of the power supply control apparatus 1 in which the control board 3 and the screws 4 are omitted. FIG. 3 is a perspective view illustrating only the bus bar module. FIG. 4 is a plan view illustrating a state (bus bar assembly 10) before bus bars 2a to be described later of the bus bar module 2 are made to be independent.

The bus bar module 2 is a member for electrically connecting the battery module 101 and the control board 3, which are different in arrangement positions or shapes of connection terminals, to each other and includes multiple bus bars 2a and a resin member 2b supporting the bus bars 2a.

The bus bar 2a is a metal pattern formed of a conductive material such as copper. One end of the bus bar 2a is formed as a substantially square connection terminal 2c and the other end is formed as a lead pin 2d.

The bus bars 2a are provided to correspond to the number of connection terminals of the battery module 101. Each of the bus bars 2a has a connection terminal 2c. The connection terminals 2c of the bus bars 2a are arranged to have the same height as the surroundings of the resin member 2b and are disposed at positions corresponding to the connection terminals of the battery module 101.

Each connection terminal 2c is provided with a throughhole 2e. The bus bar module 2 is fixed to the battery module 101 by screws (not illustrated) inserted into the throughholes 2e, and the connection terminals 2c are electrically connected to the connection terminals of the battery module 101.

The lead pins 2d of the bus bars 2a are gathered in an opening portion 2f formed on one side (the left side in FIG. 2B) of the resin member 2b, and are arranged to be exposed from the opening portion 2f. The tip of each lead pin 2d is bent toward the control board 3.

By bonding the lead pins 2d to the connection terminals of the resin member 2b by soldering, the bus bar module 2 is electrically connected to the control board 3.

Each bus bar 2a includes a bent portion 2g which is bent outside the resin member 2b and connected to the corresponding connection terminal 2c. The bent portion 2g is formed by bending a part of the bus bar 2a so as to rise upward to form a step as illustrated in FIG. 3. The bent portion 2g has a thickness and a width permitting deformation when a load acts on the corresponding connection terminal 2c and thus has flexibility.

In the power supply control apparatus 1 according to this embodiment, the bus bars 2a arranged on the right side in FIG. 2B with respect to an opening portion 2f (see FIG. 2B) to be described later become independent bus bars 2a by cutting off the junctions 11 connecting the bus bars to each other. That is, as illustrated in FIG. 4, the multiple bus bars 2a are a part of the bus bar assembly 10 in which the neighboring bus bars 2a are connected to each other with the junctions 11 before the junctions 11 are cut off. The junctions 11 are formed of the same material as the bus bars 2a. In FIG. 4, the junctions 11 are illustrated as black in order to improve visibility.

The resin member 2b is a substantially rectangular plate-like member formed of a resin supporting the bus bars 2a. The resin member 2b is formed of, for example, a polyphenylene sulfide resin (PPS). The resin member 2b has the opening portion 2f for exposing the lead pins 2d, as illustrated in FIG. 2B. Positioning pins 2h for positioning the control board 3 are formed on the top surface of the resin member 2b. In addition to the opening portion 2f, multiple opening portions 2i penetrating the resin member from the front surface to the rear surface are formed in the resin member 2b. The opening portions 2i are disposed at positions at which the junctions 11 are exposed when the bus bar assembly 10 and the resin member 2b are incorporated into a body. That is, the junctions 11 are exposed from the opening portions 2i. As illustrated in FIG. 2B, all the junctions 11 exposed from the opening portions 2i are cut off, whereby the bus bars 2a are separated from each other and are electrically independent.

The control board 3 is a printed board including a voltage detecting circuit or the like. The control board 3 is positioned with respect to the bus bar module 2 by fitting the control board to the positioning pins 2h of the bus bar module 2 and is fixed to the bus bar module 2 by the screws 4.

The control board 3 has the same substantially rectangular shape as the resin member 2b of the bus bar module 2, as illustrated in FIG. 2A. The control board 3 includes multiple notches 3a in the peripheral portion thereof so as to expose the connection terminals 2c of the bus bars 2a. In this way, in the power supply control device 1 according to this embodiment, since the control board 3 includes the notches 3a, the connection terminals 2c of the bus bar module 2 which are connected to the battery module 101 are exposed when viewed from the control board 3.

The control board 3 includes through-holes 3b (see FIG. 1) corresponding to the lead pins 2d in areas overlapping with the lead pins 2d of the bus bars 2a. Since the lead pins 2d are inserted into the through-holes 3b and the lead pins 2d are bonded to lands of the control board 3 by soldering, the bus bar module 2 and the control board 3 are electrically connected to each other.

Referring to FIG. 1 again, the cover 110 is disposed on the control board 3 and serves to protect the power supply control apparatus 1. The cover 110 is fixed to the power supply control apparatus 1, for example, with not illustrated screws or the like.

When the battery system 100 having this configuration is manufactured, first, the battery module 101 and the power supply control apparatus 1 are individually assembled.

The battery module 101 is assembled by arranging the multiple batteries 102 in the not illustrated fixed block and fixing the terminal block 103 to the batteries. In the power supply control apparatus 1, the bus bar module 2 and the control board 3 are fixed by the screws 4 and the lead pins 2d are bonded to the control board 3 by reflow type soldering.

Subsequently, the power supply control apparatus 1 and the battery module 101 are coupled to each other. Specifically, by inserting not illustrated screws into the through-holes 2e formed in the connection terminals 2c and screwing the screws to the battery module 101, the power supply control apparatus 1 and the battery module 101 are coupled to each other.

Thereafter, the cover 110 is coupled thereto to assemble the battery system 100.

When the bus bar module 2 is manufactured, the bus bar assembly 10, which is illustrated in FIG. 4, including the bus bars 2a connected to each other with the junctions 11 is first formed. The bus bar assembly is formed, for example, by press work such as punching work of punching a metal plate. In the press work, the forming of the bent portions 2g or the through-holes 2e and the bending of the lead pins 2d are performed at the same time.

The bus bars 2a (bus bars 2a arranged on the left side than the opening portion 2f in FIG. 2B) not included in the bus bar assembly 10 are formed in parallel with the forming of the bus bar assembly 10.

Subsequently, the bus bar assembly 10, the bus bars 2a, and the resin member 2b are incorporated into a body by insert molding. The opening portions 2i for exposing the junctions 11 of the bus bar assembly 10 or the like are formed at the same time by the insert molding.

Subsequently, by cutting off the junctions 11 exposed from the opening portions 2f, the bus bars 2a of the bus bar assembly 10 are separated to be electrically independent.

In the power supply control apparatus 1 and the manufacturing method of the power supply control apparatus 1 according to this embodiment, the bus bar module 2 can be manufactured by forming the multiple bus bars 2a together in a state in which the multiple bus bars are connected to each other with the junctions 11 to form the bus bar assembly 10, incorporating the bus bar assembly 10 and the resin member 2b into a body, and then cutting off the junctions 11. That is, the bus bar module 2 can be manufactured by insert-molding the bus bar assembly 10 in which the multiple bus bars 2a are incorporated into a body. Therefore, it is possible to more easily manufacture the bus bar module in comparison with a case where the individual bus bars are insert-molded to manufacture the bus bar module. As a result, in the power supply control apparatus 1 and the manufacturing method of the power supply control apparatus 1 according to this embodiment, since the manufacturing of the bus bar module 2 can be facilitated, it is possible to easily manufacture the power supply control apparatus 1.

Additionally, in the power supply control apparatus 1 and the manufacturing method of the power supply control apparatus 1 according to this embodiment, the bus bar assembly 10 can be formed using one mold. Accordingly, it is not necessary to prepare a mold for each shape of the bus bars 2a and it is thus possible to reduce the manufacturing cost of the bus bar module 2. As a result, in the power supply control apparatus 1 and the manufacturing method of the power supply control apparatus 1 according to this embodiment, since the manufacturing cost of the bus bar module 2 is reduced, it is possible to reduce the manufacturing cost of the power supply control apparatus 1.

In the power supply control apparatus 1 according to this embodiment, the resin member 2b includes the opening portions 2f and 2i penetrating the resin member from the front surface as one surface to the rear surface as the other surface. Accordingly, in comparison with a case where the opening portions 2f and 2i are not formed, the amount of resin is reduced and it is thus possible to prevent deformation due to sink marks and to decrease the weight.

In the power supply control apparatus 1 according to this embodiment, the junctions 11 are exposed from the opening portions 2i. Accordingly, it is possible to easily cut off the junctions 11 in the opening portions 2i after incorporating the bus bar assembly 10 and the resin member 2b into a body.

While the exemplary embodiment of the present invention is described above with reference to the accompanying drawings, the present invention is not limited to the exemplary embodiment. All the shapes or combinations of the elements described in the above-mentioned embodiment are only examples and can be modified in various forms depending on design requirements without departing from the gist of the present invention.

For example, the arrangement positions of the junctions 11 in the above-mentioned embodiment are only an example and can be changed. In order to enhance the strength of the bus bar assembly 10 to improve the handling properties, it is preferable that the junctions 11 be distributed all over the bus bar assembly 10. For example, when the bus bar assembly 10 is divided into two areas, i.e., the lead pins 2d side and the opposite side, the same number of junctions 11 may be disposed in both areas. By distributing the junctions 11 in this way, the opening portions 2i of the resin member 2b are also distributed as a result. Accordingly, it is possible to suppress the sink marks of the resin member 2b as a whole.

The opening portions 2i are formed in a track shape in this embodiment. However, the present invention is not limited to this configuration, and another shape such as a rectangular shape may be employed. A configuration in which notches are formed in the peripheral portion of the resin member 2b instead of the opening portions 2i and the junctions 11 are exposed from the notches may be employed.

REFERENCE SIGNS LIST

1: power supply control apparatus
2: bus bar module
2a: bus bar
2b: resin member
2c: connection terminal
2d: lead pin
2e: through-hole
2f: opening portion
2g: bent portion
2h: positioning pin
2i: opening portion
3: control board
3a: notch
3b: through-hole
4: screw
10: bus bar assembly
11: junction
100: battery system
101: battery module
102: battery
103: terminal block

The invention claimed is:

1. A method of manufacturing a bus bar module for use in a power supply control apparatus comprising a battery module and a control board, the bus bar module electrically connecting the control board and the battery module, the method comprising:
providing a bus bar assembly comprising a plurality of bus bars, wherein adjacent bus bars of the plurality of bus bars are connected with each other as junctions;
forming a resin member around the bus bar assembly such that at least a portion of each of the plurality of bus bars is embedded within the resin member, the resin member comprising opening portions corresponding to locations of the junctions such that the junctions are exposed in the opening portions; and
cutting the junctions exposed in the opening portions so that adjacent bus bars become electrically independent from each other;
wherein, at each opening portion, at least two bus bars of the plurality of bus bars extend through the opening portion.

2. The method according to claim 1,
wherein a longitudinal direction of the opening portions are set to be substantially perpendicular with respect to the extending direction of the embedded bus bars.

3. The method according to claim 2,
wherein at least two junctions are arranged in the opening portions along the longitudinal direction of the opening portion.

4. A bus bar module for use in a power supply control apparatus comprising a battery module and a control board, the bus bar module electrically connecting the control board and the battery module, the bus bar module comprising:
a resin member comprising a plurality of opening portions; and
a plurality of bus bars embedded in the resin member;
wherein positions of each of the plurality of opening portions correspond to locations where junctions between adjacent bus bars were cut during manufacturing, the junctions being a part where adjacent bus bars of the plurality of bus bars are connected with each other; and
wherein, at each opening portion, at least two bus bars of the plurality of bus bars extend through the opening portion.

5. The bus bar module according to claim 4,
wherein a longitudinal direction of the opening portions are set to be substantially perpendicular with respect to the extending direction of the embedded bus bars.

6. The bus bar module according to claim 5,
wherein at least two junctions are arranged in the opening portions along the longitudinal direction of the opening portion.

7. A power supply control apparatus comprising:
a battery module;
a control board; and
a bus bar module electrically connecting the control board and the battery module;
wherein the bus bar module comprises:
a resin member comprising a plurality of opening portions; and
a plurality of bus bars embedded in the resin member;
wherein positions of each of the plurality of opening portions correspond to locations where junctions between adjacent bus bars were cut during manufacturing, the junctions being a part where adjacent bus bars of the plurality of bus bars are connected with each other; and
wherein, at each opening portion, at least two bus bars of the plurality of bus bars extend through the opening portion.

8. The power supply control apparatus according to claim 7,
wherein a longitudinal direction of the opening portions are set to be substantially perpendicular with respect to the extending direction of the embedded bus bars.

9. The power supply control apparatus according to claim 8,
wherein at least two junctions are arranged in the opening portions along the longitudinal direction of the opening portion.

* * * * *